United States Patent [19]

Shimizu et al.

[11] Patent Number: 4,839,240
[45] Date of Patent: Jun. 13, 1989

[54] MULTILAYER PHOTOCONDUCTIVE MATERIAL

[75] Inventors: Isamu Shimizu, Yokohama; Minori Yamaguchi, Akashi, both of Japan

[73] Assignee: Kanegafuchi Chemical Industry Co., Ltd., Osaka, Japan

[21] Appl. No.: 135,517

[22] Filed: Dec. 18, 1987

Related U.S. Application Data

[63] Continuation of Ser. No. 946,153, Dec. 23, 1986, abandoned, Continuation of Ser. No. 710,247, Mar. 11, 1985, abandoned.

[30] Foreign Application Priority Data

Sep. 14, 1983 [JP] Japan ................................ 58-170309

[51] Int. Cl.$^4$ ............................................ H01L 45/00
[52] U.S. Cl. ...................................... 428/635; 148/403; 357/2
[58] Field of Search ......................... 148/403, DIG. 1; 428/635, 636; 357/2

[56] References Cited

U.S. PATENT DOCUMENTS 4,342,044 7/1982 Ovshinsky et al. .................... 357/2
4,522,663 6/1985 Ovshinsky et al. ................ 148/403

Primary Examiner—S. Kastler

[57] ABSTRACT

A multilayer photoconductive material wherein at least two kinds of alloys selected from the group consisting of amorphous silicon or germanium alloys comprising silicon and/or germanium and at least one element selected from the group consisting of carbon, fluorine and hydrogen are alternately laminated, the kinds of alloys of the adjacent layers being different from each other and the total number of the layers being at least 6, which has exhibits a high response speed and can be easily controlled in sensitivity not only to long wavelength light but also to short wavelength light.

9 Claims, 1 Drawing Sheet

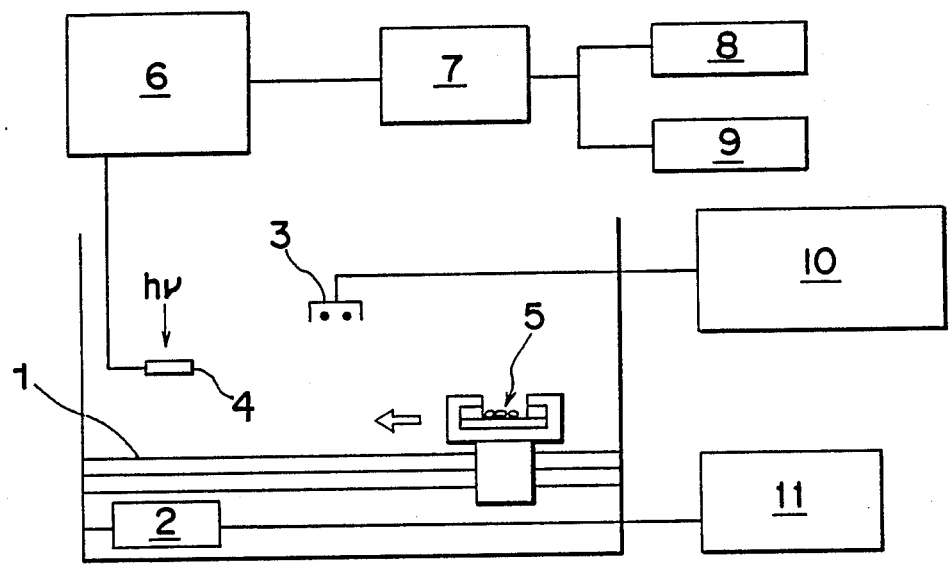

MULTILAYER PHOTOCONDUCTIVE MATERIAL

This application is a continuation of U.S. application Ser. No. 946,153, filed Dec. 23, 1986, now abandoned, which is a continuation of U.S. application Ser. No. 710,247, filed Mar. 11, 1985, now abandoned.

FIELD OF THE INVENTION

This invention relates to a multilayer photoconductive material. More particularly, it relates to a photoconductive material which exhibits a high response speed and can be easily controlled in sensitivity not only to long wavelength light but also to short wavelength light.

BACKGROUND OF THE INVENTION

As the photoconductive material which absorbs the energy of the electromagnetic radiation such as ultraviolet rays, visible rays, infrared rays and X-rays to produce carriers for electric charge and increase the electroconductivity, there are known inorganic photoconductive materials such as Se, CdS, ZnO and $As_2S_3$ as well as organic photoconductive materials such as poly-N-vinylcarbazole, trinitrofluorenone, phthalocyanine compounds and triphenylaminepolycarbonate. While these conventional inorganic or organic photoconductive materials are utilized in various fields depending upon their photoconductive characteristics, they have more or less some certain drawbacks; hence it is always necessary for their practical use to make any contrivance for overcoming those drawbacks. Thus, they are not satisfactory for overall purposes.

In general, organic photoconductive materials can be readily molded in a sheet or film form and easily controlled in sensitivity to the wavelength of light. Since, however, the mobility of the carrier for electric charge is small, their application in the field requiring a high speed response is restricted. On the other hand, inorganic photoconductive materials can show a high mobility of the carrier for electric charge. But, the control of their sensitivity to the wavelength of light is difficult. Even if succeeded in controlling the sensitivity, other characteristic properties such as the mobility of the carrier, the mobility and lifetime of the carrier are deteriorated, which leads to sacrifice of some of the photoconductive characteristics of the material. In order to overcome the above drawbacks inherent to organic or inorganic photoconductive materials, attempts have been made to design photoconductive materials of separation-of-function type which are constituted with organic photoconductive materials and inorganic photoconductive materials in combination. However, any satisfactory one has not been obtained yet.

One remarkable material is an amorphous silicon-hydrogen alloy (hereinafter referred to as "a-Si:H" in which "a-" stands for "amorphous") prepared by "rf" glow discharge.

This alloy has various advantages over the above conventional materials. The a-Si:H alloy has a wide sensitive wavelength region in a visible region between blue and red and good mechanical strength. Further, it is practically advantageous since it is substantially nontoxic. In applying the a-Si:H alloy as a photoconductive material, several problems should be overcome. When it is used as a photoconductive material for use in a charge-storage type device which makes use of charge depletion layers such as electrophtography or an image pick-up tube, it should have not only good photosensitivity but also electro static chargeability. The electro static chargeability of the alloy may be increased by reducing the mobility at dark of the carrier or by doping impurities to the alloy in order to shorten the lifetime of the carrier. However, as the electro static chargeability is increased, response during illumination of light and residual surface voltage are adversely affected. The impurity dopant deteriorates preferred characteristics of the a-Si:H alloy. Other method for increasing the electro static chargeability comprises providing the alloy with a blocking layer which prevents injection of the carrier from an electrode. The blocking layer is effective to a material with a low generation of the thermal carrier but may not effective to one with a high generation of the thermal carrier due to narrow band gap or shift of Fermi level to conduction band or valence band.

SUMMARY OF THE INVENTION

One object of the invention is to provide a multilayer photoconductive material with which not only a semiconductive material with large optical band gap but also one with small optical band gap is used as a charge-storage type photoconductive material such as vidicon pick up tube targets, photovoltaic devices and xerographic photoreceptors.

Another object of the invention is to provide a multilayer photoconductive material which exhibits a high response speed and can be easily controlled in sensitivity not only to long wavelength light but also to short wavelength light.

According to the present invention, there is provided a multilayer photoconductive material wherein at least two kinds of alloy selected from the group consisting of amorphous silicone or germanium alloys comprising silicon and/or germanium and at least one element selected from the group consisting of carbon, fluorine and hydrogen are alternately laminated, the kinds of alloys of the adjacent layers being different from each other and the total number of the layers being at least 6.

The multilayer photoconductive material of the invention is used not only as a charge-storage type photoconductive one but also as a planer type one.

BRIEF DESCRIPTION OF THE DRAWING

FIGURE is a schematic view of a corona electro static charging-photo attenuation tester to be used in Examples.

DETAILED DESCRIPTION OF THE INVENTION

It is well known that, although the material withs narrow optical band gap generally absorbs light with a long wavelength, it has small resistance at dark so that, on one hand, its electrostatic chargeabilty is small as a charge-storage type photoreceptor such as vidicon pick up tube targets or xerographic photoreceptors and, on the other hand, it has a high noise level as a planer type photoreceptor. These are inherent characteristics of the narrow gap material. For the production of a charge-storage type or planer type photoreceptor with good characteristics by the use of the narrow gap material, it is necessary to design a structure of the device so as to cover the drawbacks of the narrow gap material. The present invention succeeded in producing a device which has large electrostatic chargeability and a low noise level and absorbs light with a long wavelength by preparing the photoconductive material by multi-lamination of the alloys.

The multilayer structure is effective when it is applied not only to the charge-storage type device of the narrow band gap material but also to that of the wide band gap since the sensitivity to the wavelength of light is controlled by combinations of at least two materials having different optical band gap. Accordingly, the present invention makes it possible to prepare a photoreceptor having sensitivity to any wavelength of light by the combination of a wide band gap material and a narrow band gap material. Particularly, according to the present invention, a photoreceptor having high sensitivity in any region of a wide wavelength region from ultraviolet light to infrared light can be produced from the amorphous silicon and/or germanium alloys.

The amorphous alloy may be produced from $SiH_4$, $SiF_4$, $GeH_4$, $GeF_4$, $Si_nH_{2n+2}$ wherein n is an integer of 2 to 5, hydrocarbons (eg. $CH_4$, $C_2H_6$, etc.), hydrogen, helium, argon, nitrogen, $NH_3$, etc. by rf glow discharge. Among them, $SiH_4$, $GeH_4$, $Si_nH_{2n+2}$ are prefered. Specific examples of the preferred alloys are a-$Si_{1-x}C_x$:H, a-$Si_{1-x}Ge_x$:H, a-Si:H:F, a-Si:H, a-$Si_{1-x}Ge_x$:F:H, a-$Si_{1-x}C_x$:F:H, a-$Si_{1-x}N_x$:H, etc.

In case of a-Si:H, the optical band gap is controlled by adjusting the hydrogen content, and in case of a-$Si_{1-x}C_x$:H, the optical band gap and the conductivity are controlled by adjusting the hydrogen and/or carbon contents. Similarly, in case of other alloys, the optical band gap and the conductive property are controlled by adjusting the composition of the alloys. In addition, Fermi level may be shifted to conduction band or valence band by the impurity doping, for example, boron doping with $B_2H_6$ or phophorus doping with $PH_3$.

By the combination of the alloys, it is possible to design the photoconductive material of the invention having sufficient charge storageability and controllable sensitivity to the wavelength of light.

As one embodiment of the invention, production of a photoreceptor with high sensitivity around a wavelength of 600 nm will be explained.

Since a-Si:H has good photoconductivity, its application to a sensitive material of the image pick-up tube and electrophtography is investigated. Since the chargeability of a-Si:H itself is not enough for its application to such sensitive material, its improvement is required and studied. According to the present invention, this is achieved by the multilayer photoconductive material. For example, multi layers of a-Si:H and a-$Si_{1-x}C_x$:H increase chargeability. In this instance, on an underelectrode, a-Si:H layers each of about 5 to 5,000 Å, preferably 10 to 2,000 Å in thickness and a-$Si_{1-x}C_x$:H layers each of about 5 to 5,000 Å, preferably 10 to 2,000 Å in thickness are alternately deposited to form a material with an under-electrode/(a-Si:H/a-$Si_{1-x}C_x$:H)$_n$ or under-electrode/(a-$Si_{1-x}C_x$:H/a-Si:H)$_n$ structure. Of course, a dopant (e.g. $PH_3$, $B_2H_6$, $N_2$, Al, etc.) can be added to the semiconductor layers for p,n control. In a-$Si_{1-x}C_x$:H, x (i.e. carbon content) is from 0.001 to 0.50, preferably from 0.01 to 0.3. The total thickness of the layers varies with its end use and usually from 0.1 to 50 micrometers. Thus, the total number of the layers varies with the total thickness of the layers, and usually at least 6 preferably from 10 to 50,000, more preferably from 20 to 5,000.

The under-electrode may be any metallic or nonmetallic available one. Specific examples of the metallic one are aluminum, tin, nickel, chromium, copper, gold, palladium, silver, platinum, zinc, cadmium, magnesium, Nichrome alloy, stainless steel, iron or copper alloys with large conductance, etc. The non-metallic underelectrodes are those having low resistivity such as Indium tin oxide (ITO), $SnO_2$, $SnO_2$/ITO, ZnO, etc.

a-$Si_{1-x}C_x$:H may have the optical band gap ($E_{op}$) varying from 1.6 to 2.8 eV by changing the carbon and/or hydrogen contents and positioned in any order. It is possible to produce a multilayer film with a number of fluctuations of potential through the film thickness, and the pattern of the fluctuations is controlled by adjusting the carbon and/or hydrogen contents. That is, potential profile of the under-electrode/(a-Si:H/a-$Si_{1-x}C_x$:H)$_n$ or under-electrode/(a-$Si_{1-x}C_x$:H/a-Si:H)$_n$ structure may be varied by changing the total number of the layers or a value of x or by adjusting the hydrogen content.

In the specification, the structures of the multi-layer is expressed by under-electrode/(a-Si:H/a-$Si_{1-x}C_x$:H)$_n$ or under-electrode/(a-$Si_{1-x}C_x$:H/a-Si:H)$_n$. This does not necessarily means that two layers each having the same composition are alternately layered. The a-$Si_{1-x}C_x$:H or a-Si:H layer may have different composition, namely different carbon and/or hydrogen contents in the same multilayer material so as to obtain desired optical conductive characteristics. In addition, the thickness of the layers may be different from each other.

In another embodiment of the present invention, a multilayer photoconductive material is prepared from a combination of the narrow band gap material (e.g. a-$Si_{1-x}Ge_x$:H, a-$Si_{1-x}Ge_x$:F:H, etc.) and the wider band gap material (e.g. a-Si:H, a-$Si_{1-x}C_x$:H, etc.). a-$Si_{1-x}Ge_x$:H or a-$Si_{1-x}Ge_x$:F:H absorbes more light with a long wavelength of 650 to 1,000 nm as the Ge content increases. For example, a-$Si_{0.7}Ge_{0.3}$:F:H (x=0.3) absorbes light with a wavelength of 400 to 800 nm, and an optical conductive material with $E_{op}$ of about 1.3 to 1.5 eV is prepared by rf glow discharge. Since conductivity at dark of the layer of this alloy is as large as $10^{-7}$ to $10^{-6}$ ohm$^{-1}$.cm$^{-1}$, it is hardly used as a xerographic or image pick up tube photoreceptor. When it is, however, used in combination with a-Si:H, a-$Si_{1-x}C_x$:H, a-Si:F:H or a-$Si_{1-x}C_x$:F:H, the prepared multilayer photoconductive material has improved optical conductive characteristics and charge storageability and is preferably used as the photoreceptor. For example, on a substrate with transparent under-electrode, layers of a-$Si_{1-x}Ge_x$:F:H (x=0.3) and a-Si:H each having thickness of about 5 to 5,000 Å are alternately layered to give a multilayer photoreceptor having sensitivity to light with a wavelength of 400 to 800 nm and enough chargeability for a target of the image pick-up tube. When comparatively narrow band gap material a-$Si_{1-x}Ge_x$:F:H is combined with a wider band gap material a-$Si_{1-x'}C_{x'}$:F:H, a photoreceptor with good chargeability is prepared. In this instance, when x of a-$Si_{1-x}Ge_x$:F:H is 0.3 and layers each having thickness of 5 to 5,000 Å are layered to give total thickness of 2 to 30 micrometers, the chargeability of the multilayer material increases while the photosensitivity tends to decrease, as x' of a-$Si_{1-x'}C_{x'}$:F:H increases from 0.01 to 0.50.

The present invention has been described by referring the combinations of a-Si:H and a-$Si_{1-x}C_x$:H, a-$Si_{1-x}Ge_x$:F:H and a-Si:H, and a-$Si_{1-x}Ge_x$:F:H and a-$Si_{1-x}C_x$:H. Analogously, a photoreceptor with large electrostatic chargeability may be prepared from other combinations, for example, of a-$Si_{1-x}Ge_x$:H and a-Si:H, a-Si:F:H, a-Si$_{1-x}$C$_x$:H or a-Si$_{1-x}$C$_x$:F:H. In addition, a photoreceptor with large electrostatic chargeability and good photoresponsibility may be prepared from a combination of a-Si$_{1-x}$Ge$_x$:F:H and a-Si:F:H or a-Si$_{1-x}$C$_x$:F:H, or of a-Si:H and a-Si$_{1-x}$C$_x$:F:H, or of a-Si:H and a-Si$_{1-x}$C$_x$:H or a-Si$_{1-x}$C$_x$:F:H. The multilayer structure of the invention may be prepared from 3 or more different alloys. For example, initially the layers are prepared from the combination of a-Si$_{1-x}$C$_x$:H and a-Si:H, then the combination of a-Si:H and a-Si$_{1-x}$Ge$_x$:H or a-Si$_{1-x}$Ge$_x$:F:H and finally the combination of a-Si$_{1-x}$C$_x$:F:H and a-Si:F:H.

Generally, the alloy is deposited by chemical vapor deposition by rf glow discharge. Usually, the glow discharge is carried out at a temperature from a room temperatur to 450° C., preferably frm 50° to 350° C. Pressure is usually from 0.01 to 10 Torr, preferably from 0.1 to 5 Torr. The glow power is usually from 0.001 to 0.5 W/cm$^2$, preferably from 0.01 to 0.2 W/cm$^2$. Detailed procedures and preferred glow discharge conditions are described in below described Examples.

The present invention will be hereinafter explained further in detail by following Examples, wherein % is by volume unless otherwise indicated.

EXAMPLE 1

A substrate used was a glass plate for one inch vidicon target which had been plated with aluminum by vacuum evaporation. On the substrate, multi layers were formed by rf glow discharge by means of a capacitive coupling type reactor under the following conditions:

| A: a-Si:H layers | |
|---|---|
| Gas mixture: | 10% of SiH$_4$ and 90% of H$_2$ (Tank I) |
| Substrate temperature, Ts: | 250° C. |
| Rf glow power, Pw: | 30 W |
| Internal pressure of reactor, P: | 500 mTorr |
| B: a-Si$_{1-x}$C$_x$:H layers | |
| Gas mixture: | 7% of SiH$_4$, 3% of CH$_4$ and 90% of H$_2$ (Tank II) |
| Substrate temperature, Ts: | 250° C. |
| Rf glow power, Pw: | 30 W |
| Internal pressure of reactor, P: | 500 mTorr |

After evacuating the rf glow discharge reactor to 10$^{-5}$ Torr or lower, a substrate holder was heated so as to raise the substrate temperature to 250° C. and kept at the same temperature. Then, the gas mixture A was jetted in the reactor from Tank I and reacted under the above conditions A for 3 minutes to deposit an a-Si:H layer. After terminating the gas supply from Tank I and the internal pressure of reactor reached 10 mTorr or lower, the gas mixture B was jetted in the reactor from Tank II and glow discharge was carried out under the above conditions B for 2 minutes to deposit the second layer. These procedures were repeated to alternately deposit 50 a-Si:H layers and 50 a-Si$_{1-x}$C$_x$:H layers (total number of layers of 100). The total thickness of the multi layers was measured with a tarry step thickness meter to be 4.0 micrometers.

Corona electro static chargeability and responsibility to light with a wavelength of 600 nm of the thus produced multilayer material were examined by means of a corona electro static charging-photo attenuation tester, a schematic view of which is shown in FIGURE. In this tester, a sample 5 on a rack 1 is transferred below a corona charger 3 by means of a motor 2 which is connected with a stage-control device. The sample 5 is negatively charged at $-6$ kV by the corona charger 3 which is connected with a high voltage supplying device 10. Surface potential at dark of the sample is measured by means of a surface potential meter 6 (manufactured by TREK). Thereafter, light with a wavelength of 600 nm is illuminated on the sample surface through a monochromater (manufactured by Bausch & Lomb) with light intensity of 0.02 mW/cm$^2$, and a decay rate of the surface potential is measured with a probe 4. The decay rate of the surface potential is measured and analyzed by recording signals detected by the surface potential meter 6 by means of a wave recording device 7 (manufactured by Kawasaki Electronica), after measurement, reading the recorded signals by means of a recorder 8 or a tape perforater 9 and analyzing them.

The multilayer film produced in Example 1 had chargeability of 45 V/micrometer and sufficiently rapid charge decreasing performance to light with a wavelength of 600 nm. Light exposure necessary to decrease the surface potential to half (half decay light exposure energy, $\Delta E_{\frac{1}{2}}$) was 1.0 $\mu$J/cm$^2$. The multilayer film had high sensitivity region in a slightly shorter wavelength region of 550 to 600 nm than a-Si:H.

EXAMPLE 2

In the same manner as in Example 1 but reversing the depositing order of the s-Si:H layer and the a-Si$_{1-x}$C$_x$:H, a multilayer film was produced. Chargeability and half light exposure of the produced film were 50 V/micrometer and 1.2 $\mu$J/cm$^2$, respectively, which are satisfactory performances. This film also had high sensitivity region in a slightly shorter wavelength region than a-Si:H.

EXAMPLE 3

The same substrate as in Example 1 was used. On the substrate, multi layers were formed by rf glow discharge by means of a capacitive coupling type reactor under the following conditions:

| A: a-Si:H layers | |
|---|---|
| Gas mixture: | 10% of SiH$_4$ and 90% of H$_2$ (Tank I) |
| Substrate temperature, Ts: | 250° C. |
| Rf glow power, Pw: | 30 W |
| Internal pressure of reactor, P: | 200 mTorr |
| B: a-Si$_{1-x}$Ge$_x$:H layers | |
| Gas mixture: | 7.5% of SiH$_4$, 2.5% of GeH$_4$ and 90% of H$_2$ (Tank II) |
| Substrate temperature, Ts: | 250° C. |
| Rf glow power, Pw: | 30 W |
| Internal pressure of reactor, P: | 200 mTorr |

After evacuating an rf glow discharge reactor to 10$^{-5}$ Torr or lower, a substrate holder was heated so as to raise the substrate temperature to 250° C. and kept at the same temperature. Then, the gas mixture A was jetted in the reactor from Tank I and reacted under the above conditions A for 3 minutes to deposit an a-Si:H layer. After terminating the gas supply from Tank I and the internal pressure of reactor reached 10 mTorr or lower, the gas mixture B was jetted in the reactor from Tank II and glow discharge was carried out under the above conditions B for one minute to deposit the second layer of a-Si$_{1-x}$Ge$_x$:H. These procedures were repeated to alternately deposit 30 a-Si:H layers and 30 a-Si$_{1-x}$Ge$_x$:H layers (total number of layers of 60). The total thickness of the multi layers was measured in the same manner as in Example 1 to be 2.0 micrometers.

The thus produced thin film was used as a target of the image pick-up tube and its photoconductive characteristics were examined. At 30 V of target voltage of the image pick-up tube and 8 V of filament voltage, light with a wavelength of 650 nm was illuminated on the thin film to flow photocurrent with photoconductive gain of about 0.9. Light intensity after passing through the semi-transparent aluminum was $6.2 \times 10^{12}$ photons/cm$^2$.sec. The thin film had good blocking property up to 5 V of target voltage. When an image of a test pattern was thrown on the film by means of a lens, the image of the test pattern was made on CRT (640 dots×400 dots) with good resolution. This film had high sensitivity region in a slightly longer wavelength region than a-Si:H so that it was sensitive to light with a wavelength of 650 to 750 nm.

EXAMPLE 4

The same substrate as in Example 1 was used. On the substrate, multi layers were formed by rf glow discharge by means of a capacitive coupling type reactor under the following conditions:

| A: a-Si:H layers | |
|---|---|
| Gas mixture: | 10% of SiH$_4$ and 90% of H$_2$ (Tank I) |
| Substrate temperature, Ts: | 250° C. |
| Rf glow power, Pw: | 30 W |
| Internal pressure of reactor, P: | 200 mTorr |
| B: a-Si$_{1-x}$Ge$_x$:H layers | |
| Gas mixture: | 7.5% of SiH$_4$, 2.5% of GeH$_4$ and 90% of H$_2$ (Tank II) |
| Substrate temperature, Ts: | 250° C. |
| Rf glow power, Pw: | 30 W |
| Internal pressure of reactor, P: | 200 mTorr |
| C: a-Si$_{1-x}$C$_x$:H layers | |
| Gas mixture: | 7% of SiH$_4$, 3% of CH$_4$ and 90% of H$_2$ (Tank III) |
| Substrate temperature, Ts: | 250° C. |
| Rf glow power, Pw: | 30 W |
| Internal pressure of reactor, P: | 500 mTorr |

After evacuating an rf glow discharge reactor to $10^{-5}$ Torr or lower, a substrate holder was heated so as to raise the substrate temperature to 250° C. and kept at the same temperature. Then, the gas mixture C was jetted in the reactor from Tank III and reacted under the above conditions C for one minutes to deposit an a-Si$_{1-x}$C$_x$:H layer. After terminating the gas supply from Tank III and the internal pressure of reactor reached 10 mTorr or lower, the gas mixture B was jetted in the reactor from Tank II and glow discharge was carried out under the above conditions B for one minutes to deposit the second layer of a-Si$_{1-x}$Ge$_x$:H. After terminating the gas supply from Tank II and the internal pressure of reactor reached 10 mTorr or lower, the gas mixture A was jetted from Tank I and glow discharge was carried out to deposit the third layer of a-Si:H. These procedures were repeated to alternately deposit 30 a-Si$_{1-x}$-C$_x$:H layers, 30 a-Si$_{1-x}$Ge$_x$:H layers and 30 a-Si:H layers (total number of layers of 90). The total thickness of the multi layers was measured in the same manner as in Example 1 to be 3.0 micrometers.

Chargeability by the corona charger at −6 kV and half decay light exposure energy of the produced film by light with a wavelength of 650 nm were 40 V/micrometer and 2.1 μJ/cm$^2$, respectively, which are satisfactory performances. When an image of a test pattern was thrown on the film by means of a lens, the image of the test pattern was made with good resolution.

EXAMPLE 5

A substrate used was a glass plate for one inch vidicon target which had been plated with aluminum by vacuum evaporation. On the substrate, multi layers were formed by rf glow discharge by means of a capacitive coupling reactor under the following conditions:

| A: a-Si:F:H layers | |
|---|---|
| Gas mixture: | 70% of SiF$_4$ and 30% of H$_2$ (Tank I) |
| Substrate temperature, Ts: | 300° C. |
| Rf glow power, Pw: | 100 W |
| Internal pressure of reactor, P: | 200 mTorr |
| B: a-Si$_{1-x}$C$_x$:H layers | |
| Gas mixture: | 7% of SiH$_4$, 3% of CH$_4$ and 90% of H$_2$ (Tank II) |
| Substrate temperature, Ts: | 300° C. |
| Rf glow power, Pw: | 30 W |
| Internal pressure of reactor, P: | 500 mTorr |

In the same manner as in Example 1 but carrying out glow discharge for 5 minutes and one minute under the conditions A and B, respectively, 50 a-Si:F:H and 50 a-Si$_{1-x}$-C$_x$:H layers were alternately deposited to produce a multilayer film having total thickness of 4.0 micrometers. Chargeability and half light exposure by light with a wavelength of 600 nm were examined by the same manner as in Example 1 to find 43 V/micrometer and 1.7 μJ/cm$^2$, respectively.

EXAMPLE 6

The same substrate as in Example 1 was used. On the substrate, multi layers were formed by rf glow discharge by means of a capacitive coupling type reactor under the following conditions:

| A: a-Si:H layers | |
|---|---|
| Gas mixture: | 10% of SiH$_4$ and 90% of H$_2$ (Tank I) |
| Substrate temperature, Ts: | 300° C. |
| Rf glow power, Pw: | 30 W |
| Internal pressure of reactor, P: | 200 mTorr |
| B: a-Si$_{1-x}$Ge$_x$:F:H layers | |
| Gas mixture: | 69.775% of SiH$_4$, 0.225% of GeF$_4$ and 30% of H$_2$ (Tank II) |
| Substrate temperature, Ts: | 300° C. |
| Rf glow power, Pw: | 30 W |
| Internal pressure of reactor, P: | 200 mTorr |
| C: a-Si$_{1-x}$C$_x$:H layers | |
| Gas mixture: | 7% of SiH$_4$, 3% of CH$_4$ and 90% of H$_2$ (Tank III) |
| Substrate temperature, Ts: | 300° C. |
| Rf glow power, Pw: | 30 W |
| Internal pressure of reactor, P: | 200 mTorr |

In the same manner as in Example 4 but carrying out glow discharge for one minute, one minute and 3 minutes under the conditions C, B and A, respectively, each 35 layers were alternately deposited to produce a multilayer film having thickness of about 4.0 micrometers. Chargeability and half light exposure by light with a wavelength of 650 nm were examined by the same manner as in Example 1 to find 48 V/micrometer and 1.4 μJ/cm$^2$, respectively. As the target of the image pick-up, it had good blocking property up to 10 V of target voltage. Responsibility and resolution to light with a wavelength of 400 to 700 nm were satisfactory.

EXAMPLES 7-10

In the same manner as in Example 1 but using, as the substrate, chromium (Example 7), Nichrome (Example 8), ITO (Example 9) or SnO$_2$ (Example 10) in place of the glass plate, a multilayer film was produced. Characteristics of the film were shown in Table.

TABLE

| Example No. | Thickness of film ($\mu$) | Total No. of layers | Chargeability (V/$\mu$m) | Half light exposure ($\mu$J/cm$^2$) |
| --- | --- | --- | --- | --- |
| 1 | 4.0 | 100 | 45 | 1.0 |
| 7 | 3.8 | 100 | 40 | 1.2 |
| 8 | 3.8 | 90 | 40 | 1.1 |
| 9 | 4.1 | 90 | 47 | 1.2 |
| 10 | 4.0 | 100 | 46 | 1.0 |

What is claimed is:

1. A multilayer photoconductive material comprising at least six alternately laminated layers of a wide energy band gap material and a narrow energy band gap material, both composed of amorphous alloys containing an element selected from the group consisting of silicon and germanium, and mixtures thereof, and an additional element selected from the group consisting of carbon, fluorine and hydrogen.

2. A multilayer photoconductive material according to claim 1, wherein the amorphous alloy is produced from a gaseous mixture of a raw material selected from the group consisting of SiH$_4$, SiF$_4$, GeH$_4$, GeF$_4$ and Si$_n$H$_{2n+2}$ wherein n is an integer of 2 to 5, and selected from the group consisting of CH$_4$, C$_2$H$_6$, hydrogen, helium and argon.

3. A multilayer photoconductive material according to claim 2, wherein the raw material is selected from the group consisting of SiH$_4$, GeH$_4$, and Si$_n$H$_{2n+2}$ wherein n is an integer of 2 to 5.

4. A multilayer photoconductive material according to claim 1, wherein the amorphous alloy is selected from the group consisting of a-Si$_{1-x}$C$_x$:H, a-Si$_{1-x}$Ge$_x$:H, a-Si:H:F, a-Si:H, a-Si$_{1-x}$Ge$_x$:F:H, a-Si$_{1-x}$C$_x$:F:H and a-Si$_{1-x}$N$_x$:H.

5. A multilayer photoconductive material according to claim 1, wherein the thickness of each alloy layer is from 5 to 5,000 Å.

6. A multilayer photoconductive material according to claim 1, wherein the total thickness of the layers is from 0.1 to 50 micrometers.

7. A multilayer photoconductive material according to claim 1, wherein the amorphous alloy is deposited by means of rf glow discharge of a gaseous mixture of a raw material selected from the group consisting of SiH$_4$, SiF$_4$, GeH$_4$, GeF$_4$ and Si$_n$H$_{2n+2}$ wherein n is an integer of 2 to 5, and a gas selected from the group consisting of CH$_4$, C$_2$H$_6$, hydrogen, helium and argon.

8. A multilayer photoconductive material according to claim 7, wherein the raw material is selected from the group consisting of SiH$_4$, GeH$_4$, and Si$_n$H$_{2n+2}$ wherein n is an integer of 2 to 5.

9. A multilayer photoconductive material according to claim 1, wherein the alloy in one layer is different from the alloy in an adjacent layer.

* * * * *